(12) United States Patent
Cassia

(10) Patent No.: US 8,283,964 B2
(45) Date of Patent: Oct. 9, 2012

(54) LEVEL SHIFTERS AND HIGH VOLTAGE LOGIC CIRCUITS

(75) Inventor: Marco Cassia, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/633,675

(22) Filed: Dec. 8, 2009

(65) Prior Publication Data

US 2011/0018606 A1   Jan. 27, 2011

Related U.S. Application Data

(60) Provisional application No. 61/227,730, filed on Jul. 22, 2009.

(51) Int. Cl.
*H03L 5/00* (2006.01)
(52) U.S. Cl. ............... 327/333; 326/61; 326/81
(58) Field of Classification Search ......... 326/52–63, 326/80–81; 327/306, 333
See application file for complete search history.

(56) References Cited

U.S. PATENT DOCUMENTS

| | | | |
|---|---|---|---|
| 6,333,662 B1 | 12/2001 | Umezawa et al. | |
| 6,614,283 B1 | 9/2003 | Wright et al. | |
| 6,664,943 B1 | 12/2003 | Nakajima et al. | |
| 7,368,969 B2 | 5/2008 | Suzuki et al. | |
| 7,420,393 B2 * | 9/2008 | Huang et al. | 326/68 |
| 7,622,954 B2 * | 11/2009 | Illegems et al. | 326/68 |
| 7,847,590 B2 * | 12/2010 | Pamperin | 326/68 |
| 2003/0222678 A1 | 12/2003 | Sun | |
| 2006/0066349 A1 | 3/2006 | Murakami | |
| 2007/0159218 A1 | 7/2007 | Srinivas et al. | |
| 2007/0236272 A1 | 10/2007 | Min et al. | |

FOREIGN PATENT DOCUMENTS

EP   0859469 A2   8/1998

OTHER PUBLICATIONS

International Search Report and Written Opinion—PCT/US2010/042968, International Search Authority—European Patent Office—Jan. 31, 2011.
Partial International Search Report—PCT/US2010/042968—International Search Authority, European Patent Office, Nov. 8, 2010.

* cited by examiner

*Primary Examiner* — Dinh T. Le
(74) *Attorney, Agent, or Firm* — Ramin Mobarhan

(57) ABSTRACT

Level shifters and high voltage logic circuits implemented with MOS transistors having a low breakdown voltage relative to the voltage swing of the input and output signals are described. In an exemplary design, a level shifter includes a driver circuit and a latch. The driver circuit receives an input signal having a first voltage range and provides a drive signal having a second voltage range. The first and second voltage ranges may cover positive and negative voltages or different ranges of positive voltages. The latch receives the drive signal and provides an output signal having the second voltage range. The driver circuit may generate a control signal having a full voltage range based on the input signal and may then generate the drive signal based on the control signal. The level shifter may be used to implement a high voltage logic circuit.

15 Claims, 8 Drawing Sheets

LEVEL SHIFTERS AND HIGH VOLTAGE LOGIC CIRCUITS

I. CLAIM OF PRIORITY UNDER 35 U.S.C. §119

The present Application for Patent claims priority to Provisional U.S. Application Ser. No. 61/227,730, entitled "LEVEL-SHIFTER CONTROL METHODOLOGY," filed Jul. 22, 2009, assigned to the assignee hereof, and expressly incorporated herein by reference.

BACKGROUND

I. Field

The present disclosure relates generally to electronics, and more specifically to level shifters and logic circuits.

II. Background

A level shifter is a circuit that receives a digital input signal with a first voltage range and provides a digital output signal with a second voltage range that is different from the first voltage range. A logic circuit is a circuit that receives one or more digital input signals, performs a particular logic function on the digital input signal(s), and provides one or more digital output signals. A digital signal has one of multiple (typically two) possible logic values at any given moment. For example, a digital signal may have a high voltage level for logic high or a low voltage level (e.g., zero Volts (0V)) for logic low.

A level shifter or a logic circuit may be implemented with metal oxide semiconductor (MOS) transistors to obtain small size and low power dissipation. The MOS transistors may be unable to handle a full voltage range, which may cover both the first and second voltage ranges. For example, the full voltage range may exceed a breakdown voltage of the MOS transistors. It may be desirable to implement the level shifter and the logic circuit with MOS transistors having a breakdown voltage that is smaller than the full voltage range.

DETAILED DESCRIPTION

The word "exemplary" is used herein to mean "serving as an example, instance, or illustration." Any design described herein as "exemplary" is not necessarily to be construed as preferred or advantageous over other designs.

Level shifters and high voltage logic circuits implemented with MOS transistors having a breakdown voltage that may be smaller than the full voltage range of the digital input and output signals are described herein. The level shifters and high voltage logic circuits may be used for various applications such as for interface circuits between digital circuits and analog circuits, for control circuits to turn on or off switches, etc.

Figure 1A:
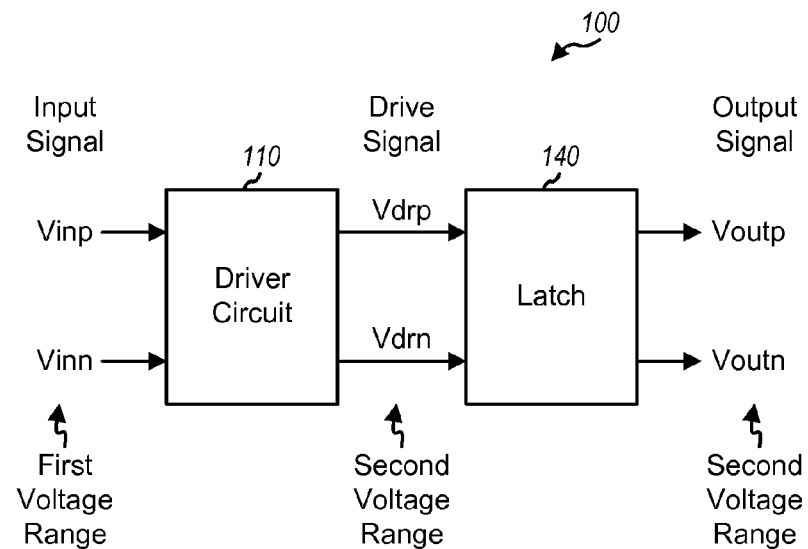
FIGS. 1A and 1B show two exemplary designs of a level shifter.

FIG. 1A shows a block diagram of an exemplary design of a level shifter 100. In this exemplary design, level shifter 100 includes a driver circuit 110 coupled to a latch 140. Driver circuit 110 receives a differential digital input signal comprising Vinp and Vinn signals having a first voltage range. Driver circuit 110 provides a differential digital drive signal comprising Vdrp and Vdrn signals having a second voltage range, which is different from the first voltage range. Latch 140 receives the differential drive signal and provides a differential digital output signal comprising Voutp and Voutn signals having the second voltage range. Driver circuit 110 and latch 140 may be implemented as described below.

Figure 1B:
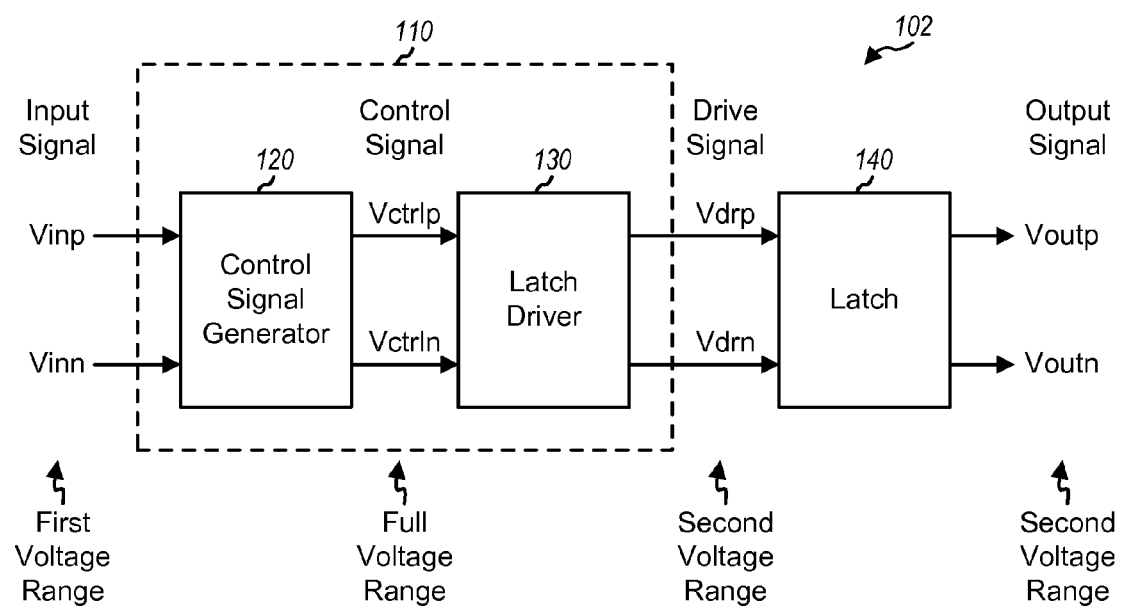

FIG. 1B shows a block diagram of an exemplary design of a level shifter 102. In this exemplary design, level shifter 102 includes a control signal generator 120, a latch driver 130, and latch 140, all coupled in series. Control signal generator 120 and latch driver 130 are part of driver circuit 110 in FIG. 1A.

Control signal generator 120 receives the differential digital input signal comprising the Vinp and Vinn signals having the first voltage range. Control signal generator 120 provides a differential digital control signal comprising Vctrlp and Vctrln signals having a full voltage range. Latch driver 130 receives the differential control signal and provides the differential digital drive signal comprising the Vdrp and Vdrn signals having the second voltage range. Latch 140 receives the differential drive signal and provides the differential digital output signal comprising the Voutp and Voutn signals having the second voltage range. Control signal generator 120 and latch driver 130 may be implemented as described below.

In FIGS. 1A and 1B, the first voltage range may cover the range of voltages for the Vinp and Vinn signals. The second voltage range may cover the range of voltages for the Voutp and Voutn signals. The full voltage range may cover both the first and second voltage ranges. In an exemplary design, the first voltage range is non-overlapping with the second voltage range. For example, the first voltage range may cover circuit ground (0V) to a positive power supply voltage (Vdd), the second voltage range may cover 0V to a negative power supply voltage (Vss), and the full voltage range may cover Vss to Vdd. As another example, the first voltage range may cover 0V to a first positive power supply voltage (Vdd1), the second voltage range may cover Vdd1 to a second positive power supply voltage (Vdd2), and the full voltage range may cover 0V to Vdd2, where Vdd2 is greater than Vdd1. In another exemplary design, the first voltage range may partially overlap the second voltage range.

Figure 2:
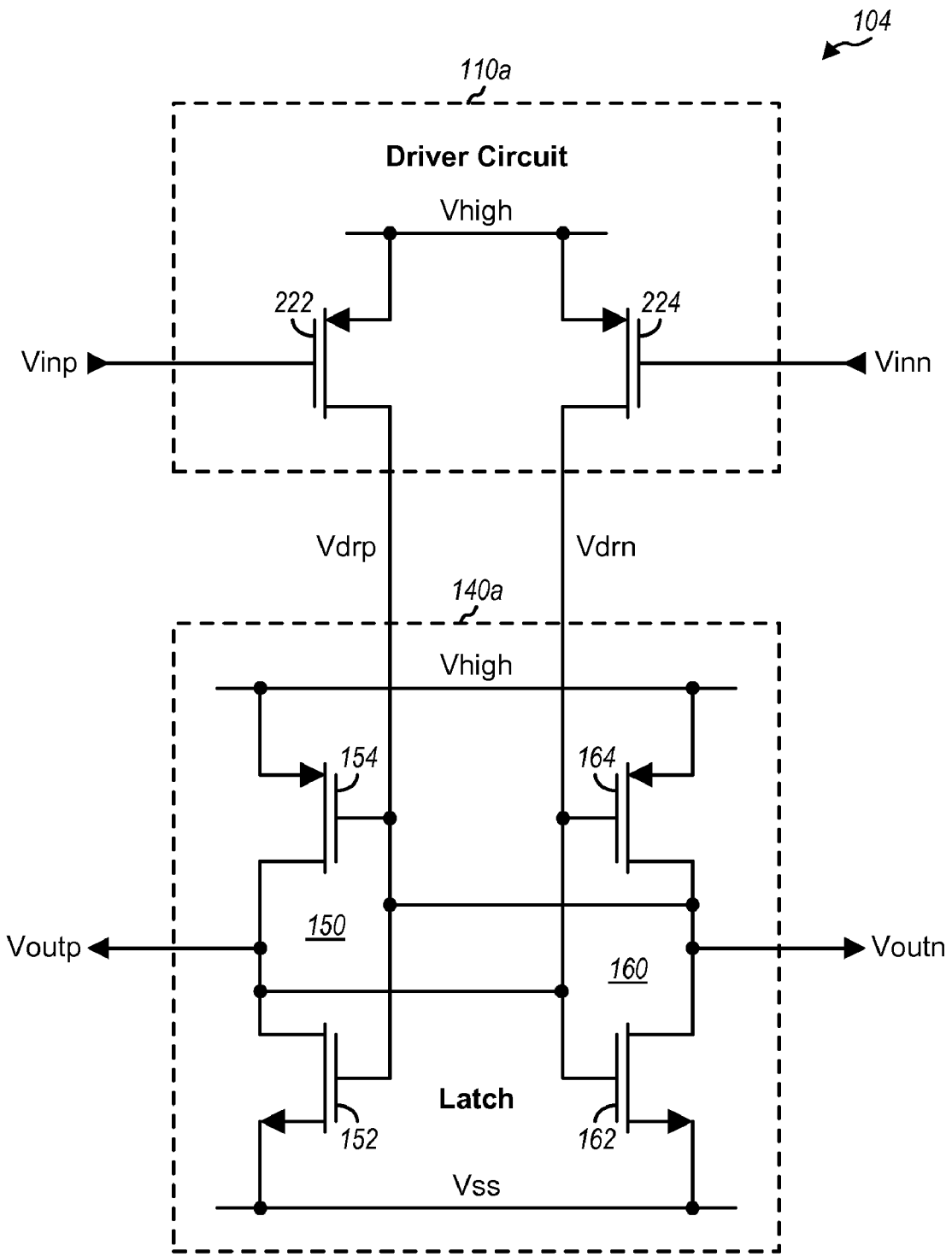
FIG. 2 shows a level shifter implemented with MOS transistors operating with a full voltage range.

FIG. 2 shows a schematic diagram of a circuit 104 implemented with MOS transistors operating with the full voltage range. Circuit 104 includes a driver circuit 110a coupled to a latch 140a. Driver circuit 110a includes two P-channel MOS (PMOS) transistors 222 and 224 that can provide Vdrp and Vdrn signals having a voltage range from Vss to Vhigh, where Vhigh may be equal to Vdd or circuit ground (0V). PMOS transistor 222 has its source coupled to Vhigh, its gate receiving the Vinp signal, and its drain providing the Vdrp signal. PMOS transistor 224 has its source coupled to Vhigh, its gate receiving the Vinn signal, and its drain providing the Vdrn signal.

Latch 140a includes a pair of inverters 150 and 160 that are cross-coupled together. Inverter 150 includes an N-channel MOS (NMOS) transistor 152 and a PMOS transistor 154 coupled in a stack configuration. NMOS transistor 152 has its source coupled to Vss, its gate coupled to the gate of PMOS transistor 154, and its drain coupled to the drain of PMOS transistor 154. The source of PMOS transistor 154 is coupled to Vhigh. The gates of MOS transistors 152 and 154 form the input of inverter 150, which receives the Vdrp signal. The drains of MOS transistors 152 and 154 form the output of inverter 150, which provides the Voutp signal. Inverter 160 includes an NMOS transistor 162 and a PMOS transistor 164 coupled in a stack configuration. NMOS transistor 162 has its source coupled to Vss, its gate coupled to the gate of PMOS transistor 164, and its drain coupled to the drain of PMOS transistor 164. The source of PMOS transistor 164 is coupled to Vhigh. The gates of MOS transistors 162 and 164 form the input of inverter 160, which receives the Vdrn signal. The drains of MOS transistors 162 and 164 form the output of inverter 160, which provides the Voutn signal. The input of inverter 150 is coupled to the output of inverter 160, and the output of inverter 150 is coupled to the input of inverter 160.

Latch 140a operates as follows. When the Vdrp signal is at logic high (e.g., Vhigh), NMOS transistor 152 is turned on, PMOS transistor 154 is turned off, and the Voutp signal is at logic low (e.g., Vss). The Vdrn signal is at logic low, NMOS transistor 162 is turned off, PMOS transistor 164 is turned on, and the Voutn signal is at logic high. Conversely, when the Vdrp signal is at logic low, NMOS transistor 152 is turned off, PMOS transistor 154 is turned on, and the Voutp signal is at logic high. The Vdrn signal is at logic high, NMOS transistor 162 is turned on, PMOS transistor 164 is turned off, and the Voutn signal is at logic low. Inverters 150 and 160 operate as a feedback circuit that can store a logic value during steady state. The Vdrp and Vdrn signals can write a new logic value into latch 140a.

Driver circuit 110a receives the Vinp and Vinn signals and generates the Vdrp and Vdrn signals. When the Vinp signal is at logic low (e.g., Vss) and the Vinn signal is at logic high (e.g., Vhigh), PMOS transistor 222 is turned on, the Vdrp signal is at logic high, PMOS transistor 224 is turned off, and the Vdrn signal is at logic low. Conversely, when the Vinp signal is at logic high and the Vinn signal is at logic low, PMOS transistor 222 is turned off, the Vdrp signal is at logic low, PMOS transistor 224 is turned on, and the Vdrn signal is at logic high. The Vinp and Vinn signals should be smaller than or equal to Vhigh−|Vthp| in order to turn on PMOS transistors 222 and 224, where Vthp is a threshold voltage for PMOS transistors 222 and 224. The Vinp and Vinn signals should be greater than or equal to Vhigh in order to turn off PMOS transistors 222 and 224. The input and output voltage ranges should overlap by a voltage that is roughly equal to the threshold voltage of PMOS transistors 222 and 224.

In the exemplary design shown in FIG. 2, PMOS transistors 222 and 224 operate between the voltage range from Vss to Vhigh and have a breakdown voltage that is larger than this voltage range. It may be desirable to implement PMOS transistors 222 and 224 with MOS transistors having a breakdown voltage that is smaller than the full voltage range from Vss to Vdd. For example, PMOS transistors 222 and 224 may be implemented with PMOS transistors having a smaller breakdown voltage and having their sources coupled to circuit ground instead of Vdd. The Vinp and Vinn signals (which may have a voltage range of 0V to Vdd) would then be able to turn off these PMOS transistors but would not be able to turn on the PMOS transistors. Alternatively, PMOS transistors 222 and 224 may be replaced with NMOS transistors having a smaller breakdown voltage and having their drains coupled to circuit ground. The Vinp and Vinn signals would then be able to turn on these NMOS transistors but would not be able to turn off the NMOS transistors In an aspect, a level shifter may include a driver circuit that can receive an input signal having a first voltage range and generate a drive signal having a second voltage range. The driver circuit may be implemented with MOS transistors operating with either the first or second voltage range (instead of the full voltage range) in order to avoid exceeding the breakdown voltage.

Figure 3:
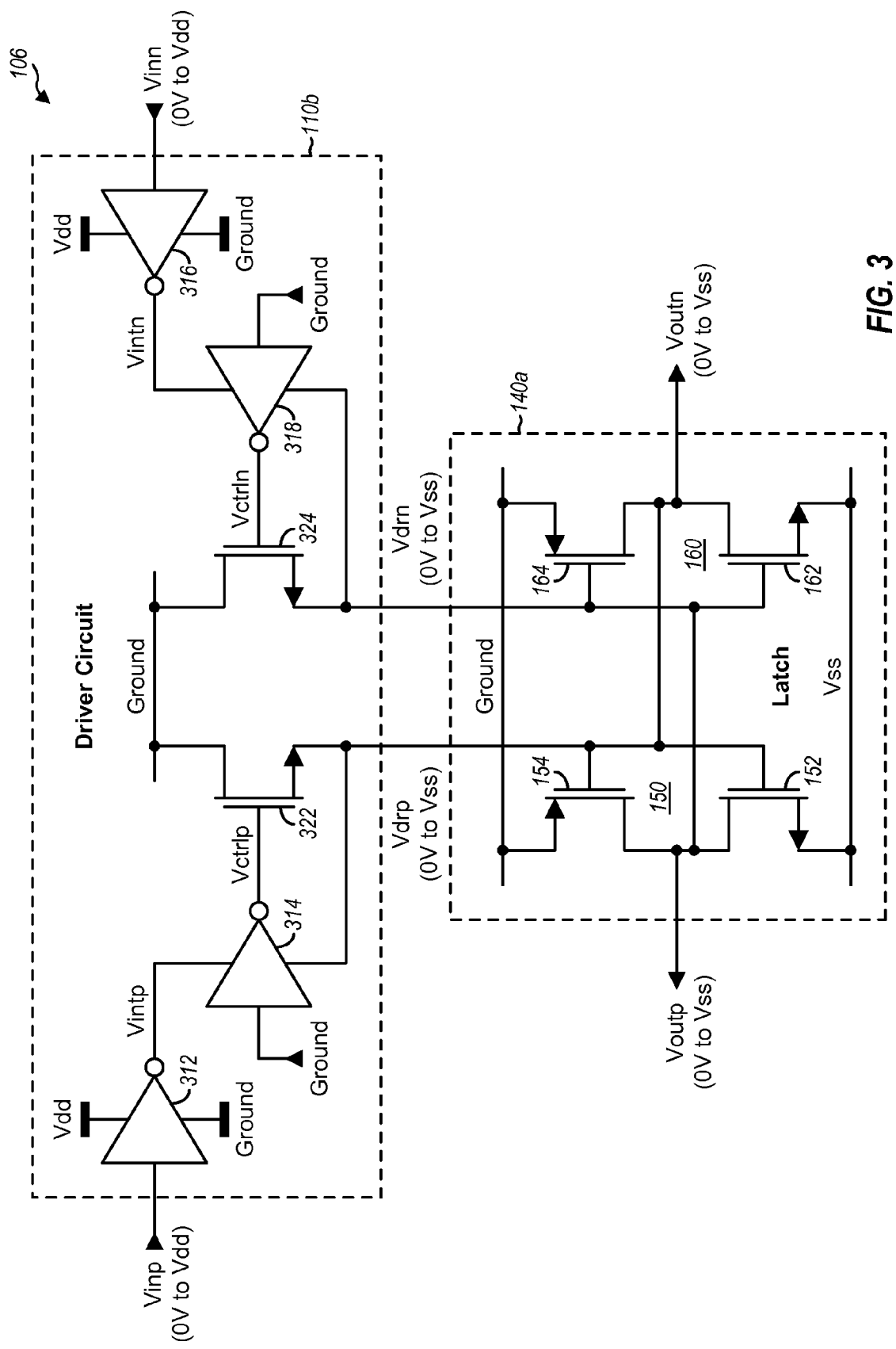
FIGS. 3 and 4 show an exemplary design of a level shifter implemented with MOS transistors operating with reduced voltage ranges.

FIG. 3 shows a schematic diagram of a level shifter 106 implemented with MOS transistors operating with non-overlapping voltage ranges. Level shifter 106 includes a driver circuit 110b coupled to latch 140a, which are an exemplary design of driver circuit 110 and latch 140 in FIG. 1A. Latch 140a includes two inverters 150 and 160 that are coupled as described above for FIG. 2.

In the exemplary design shown in FIG. 3, driver circuit 110b includes four inverters 312, 314, 316 and 318 and two NMOS transistors 322 and 324. Inverter 312 receives the Vinp signal and outputs a first intermediate signal, Vintp. Inverter 314 has its input coupled to circuit ground and its output providing a first control signal, Vctrlp. Inverter 314 receives its upper supply voltage from the Vintp signal and its lower supply voltage from the Vdrp signal. NMOS transistor 322 has its drain coupled to circuit ground, its gate receiving the Vctrlp signal from inverter 314, and its source providing the Vdrp signal. Inverter 316 receives the Vinn signal and outputs a second intermediate signal, Vintn. Inverter 318 has its input coupled to circuit ground and its output providing a second control signal, Vctrln. Inverter 318 receives its upper supply voltage from the Vintn signal and its lower supply voltage from the Vdrn signal. NMOS transistor 324 has its drain coupled to circuit ground, its gate receiving the Vctrln signal from inverter 318, and its source providing the Vdrn signal.

Inverters 312, 314, 316 and 318 may be part of control signal generator 120 in FIG. 1B. NMOS transistors 322 and 324 may be part of latch driver 130 in FIG. 1B. Inverters 312 and 316 operate between the first voltage range and receive Vdd for the upper supply voltage and circuit ground for the lower supply voltage. Inverters 314 and 318 operate between the first or second voltage range at any given moment. Depending on the logic value of the Vinp signal, inverter 314 may operate between the first voltage range and inverter 318 may operate between the second voltage range, or vice versa.

Figure 4:
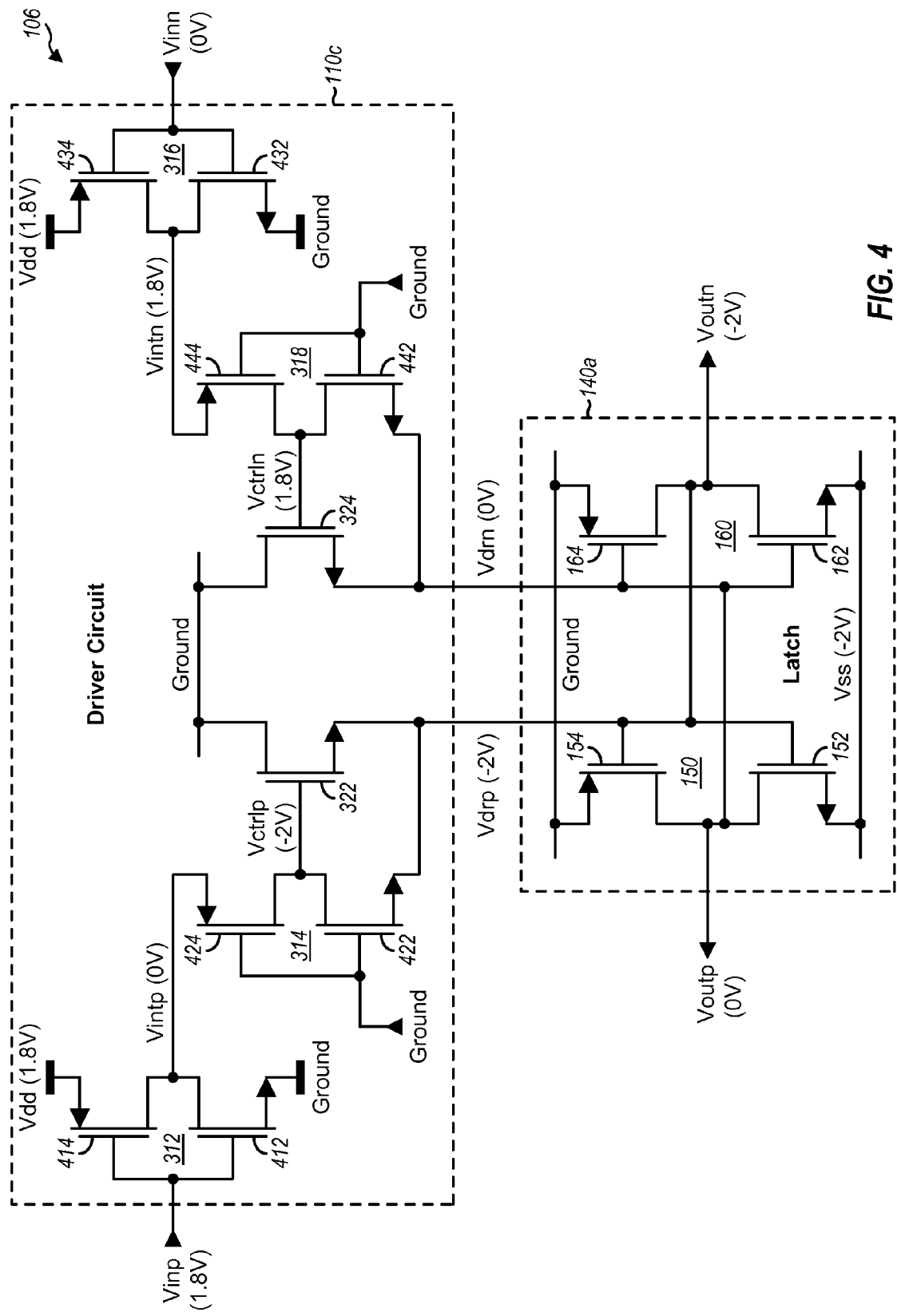

FIG. 4 shows a schematic diagram of level shifter 106, with each of inverters 312, 314, 316 and 318 being implemented with a pair of MOS transistors. In particular, inverter 312 is implemented with an NMOS transistor 412 and a PMOS transistor 414 operating between circuit ground and Vdd. Inverter 314 is implemented with an NMOS transistor 422 and a PMOS transistor 424 operating between the Vintp signal and the Vdrp signal. Inverter 316 is implemented with an NMOS transistor 432 and a PMOS transistor 434 operating between circuit ground and Vdd. Inverter 318 is implemented with an NMOS transistor 442 and a PMOS transistor 444 operating between the Vintn signal and the Vdrn signal.

FIG. 4 also shows a case in which Vdd=1.8V, Vss=−2V, the Vinp signal is at logic high, and the Vinn signal is at logic low. Level shifter 106 operates as follow. The logic low (0V) for the Vinn signal sets the output of inverter 316 to 1.8V. PMOS transistor 444 in inverter 318 observes 0V at its gate and 1.8V at its source, is turned on, and raises the output of inverter 318 to 1.8V. NMOS transistor 324 has its drain coupled to 0V, is turned on by 1.8V at its gate, and provides 0V on the Vdrn signal. Within latch 140a, NMOS transistor 162 is turned on and PMOS transistor 164 is turned off by 0V on the Vdrn signal. NMOS transistor 162 provides −2V on the Voutn signal. On the complementary side, the logic high (1.8V) for the Vinp signal sets the output of inverter 312 to 0V. NMOS transistor 422 in inverter 314 observes 0V at its gate and −2V on the Vdrp signal at its source, is turned on, and pulls the output of inverter 314 to −2V. The Vdrp signal is at −2V due to NMOS transistor 162 within latch 140a being turned on. The gate and source of NMOS transistor 322 are shorted by NMOS transistor 422 in inverter 314 being turned on. Within latch 140a, NMOS transistor 152 is turned off and PMOS transistor 154 is turned on by −2V on the Vdrp signal. PMOS transistor 154 provides 0V on the Voutp signal.

During steady state, the MOS transistors within latch 106 observe a maximum drain-to-source voltage of 2V. During a low-to-high transition or a high-to-low transition of the Vinp signal, a short voltage spike may occur across NMOS transistors 422 and 442 in inverters 314 and 318, respectively. This voltage spike may be up to Vdd−Vss, or 3.8V in the example shown in FIG. 4. This voltage spike may be mitigated by (i) adding a resistor between the source of NMOS transistor 322 and the source of NMOS transistor 422 in inverter 314 and (ii) adding a resistor between the source of NMOS transistor 324 and the source of NMOS transistor 442 in inverter 318.

NMOS transistors 422 and 442 in inverters 314 and 318, respectively, may be designed with a suitable size to ensure proper operation of level shifter 106. NMOS transistor 422 turns off NMOS transistor 322, and NMOS transistor 442 turns off NMOS transistor 324. If the on condition of NMOS transistors 422 and 442 is too strong, then NMOS transistors 322 and 324 may not be easily pulled out of their off condition (with the source tied to the gate). The size of NMOS transistors 422 and 442 may be selected such that their on condition is not too strong so that NMOS transistors 322 and 324 can be more readily pulled from the off condition.

Figure 5:
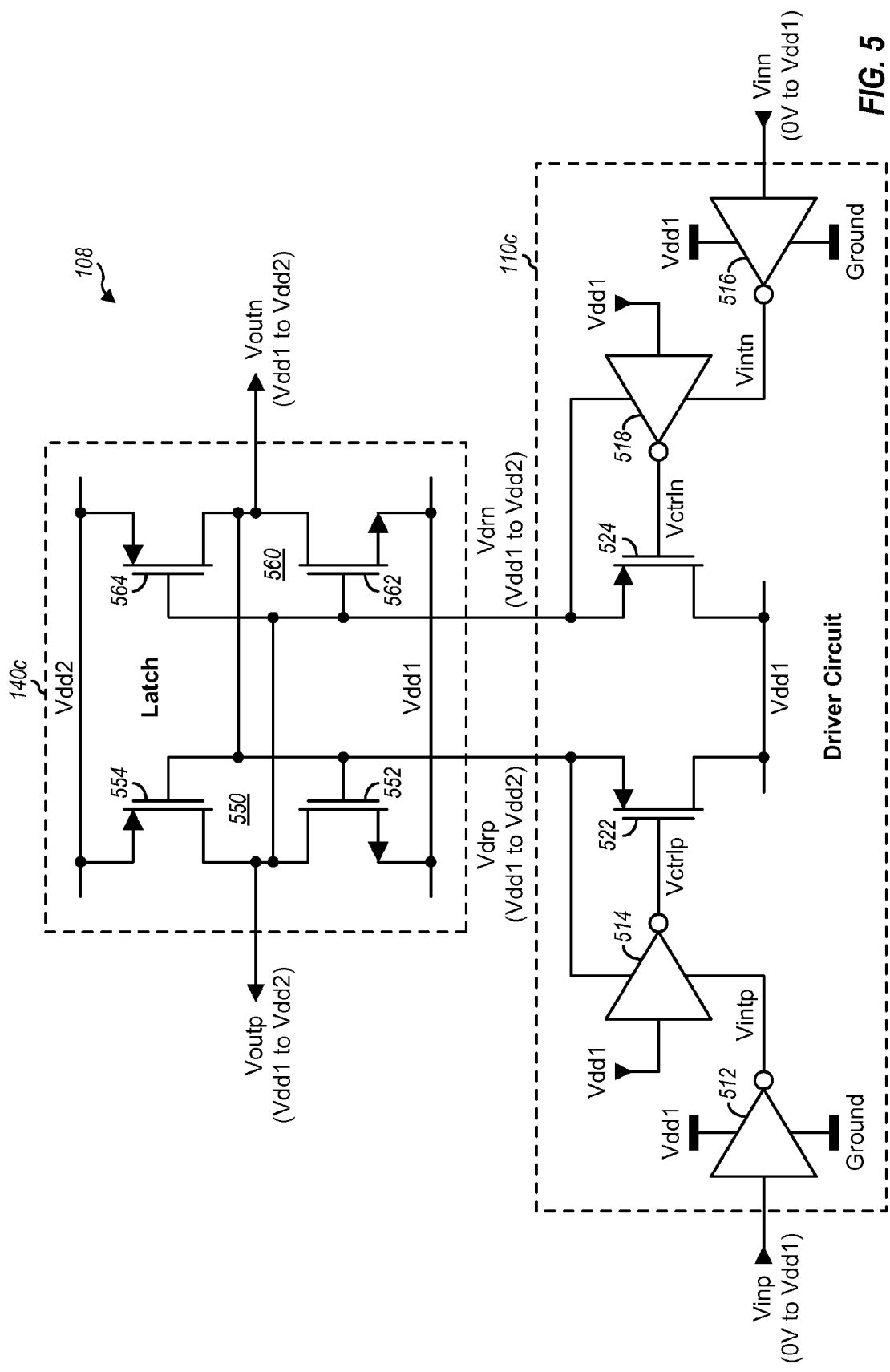
FIG. 5 shows an exemplary design of a level shifter for positive voltage ranges.

FIG. 5 shows a schematic diagram of a level shifter 108 with the input and output signals having positive voltage ranges. Level shifter 108 receives a differential input signal comprising Vinp and Vinn signals having a first voltage range from 0V to Vdd1. Level shifter 108 provides a differential output signal comprising Voutp and Voutn signals having a second voltage range from Vdd1 to Vdd2, where Vdd2>Vdd1.

Level shifter 108 includes a driver circuit 110c coupled to a latch 140c, which are another exemplary design of driver circuit 110 and latch 140 in FIG. 1A. Driver circuit 110c includes four inverters 512, 514, 516 and 518 and two PMOS transistors 522 and 524. Inverter 512 receives the Vinp signal and outputs a first intermediate signal, Vintp. Inverter 514 has its input coupled to Vdd1 and its output providing a first control signal, Vctrlp. Inverter 514 receives its upper supply voltage from the Vdrp signal and its lower supply voltage from the Vintp signal. PMOS transistor 522 has its drain coupled to Vdd1, its gate receiving the Vctrlp signal from inverter 514, and its source providing the Vdrp signal. Inverter 516 receives the Vinn signal and outputs a second intermediate signal, Vintn. Inverter 518 has its input coupled to Vdd1 and its output providing a second control signal, Vctrln. Inverter 518 receives its upper supply voltage from the Vdrn signal and its lower supply voltage from the Vintn signal. PMOS transistor 524 has its drain coupled to Vdd1, its gate receiving the Vctrln signal from inverter 518, and its source providing the Vdrn signal.

Inverters 512, 514, 516 and 518 may be part of control signal generator 120 in FIG. 1B. PMOS transistors 522 and 524 may be part of latch driver 130 in FIG. 1B. Inverters 512 and 516 operate between the first voltage range and receive Vdd for the upper supply voltage and 0V for the lower supply voltage. Inverters 514 and 518 operate between the first or second voltage range at any given moment. Depending on the logic value of the Vinp signal, inverter 514 may operate between the first voltage range and inverter 518 may operate between the second voltage range, or vice versa.

Latch 140c includes two inverters 550 and 560, which are implemented with NMOS transistors 552 and 562 and PMOS transistors 554 and 564 that are coupled in similar manner as NMOS transistors 152 and 162 and PMOS transistors 154 and 164 in FIG. 2, except for their supply connections. PMOS transistors 554 and 564 have their sources coupled to Vdd2, and NMOS transistors 552 and 562 have their sources coupled to Vdd1. Driver circuit 110c and latch 140c operate in a complementary manner to driver circuit 110b and latch 140a in FIG. 3.

The level shifters described herein may be used to implement high voltage logic circuits. A high voltage logic circuit is a logic circuit that can handle digital input and/or output signals having a larger voltage range than the breakdown voltage of the MOS transistors used to implement the logic circuit.

Figure 6:
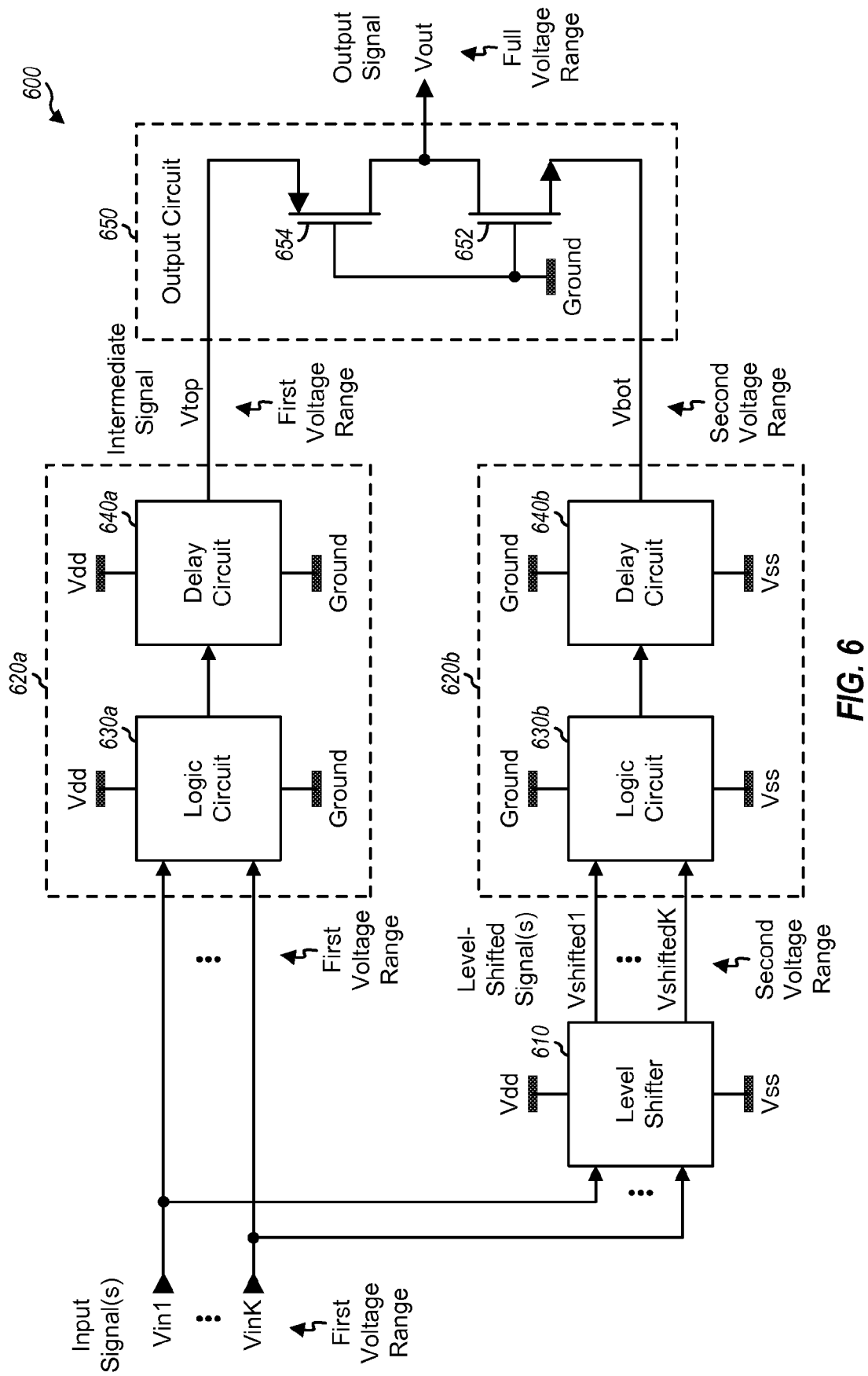
FIG. 6 shows an exemplary design of a high voltage logic circuit.

FIG. 6 shows a schematic diagram of an exemplary design of a high voltage logic circuit 600, which may be able to implement any logic function. Logic circuit 600 receives K input signals, Vin1 through VinK, having a first voltage range from 0V to Vdd, where K may be one or greater. Logic circuit 600 implements a desired logic function on the K input signals and provides an output signal, Vout, having a full voltage range from Vss to Vdd. The full voltage range covers both the first voltage range and a second voltage range from 0V to Vss.

In the exemplary design shown in FIG. 6, logic circuit 600 includes a level shifter 610, a first processing circuit 620a, a second processing circuit 620b, and an output circuit 650. Level shifter 610 operates between the full voltage range. First processing circuit 620a includes a logic circuit 630a and a delay circuit 640a that operate between the first voltage range. Second processing circuit 620b includes a logic circuit 630b and a delay circuit 640b that operate between the second voltage range. Output circuit 650 operates between the first or second voltage range at any given moment.

Level shifter 610 receives the K input signals having the first voltage range and provides K level-shifted signals, Vshifted1 through VshiftedK, having the second voltage range. Level shifter 610 may be implemented with K level shifters 106 in FIG. 3, one level shifter 106 for each input signal. Each level shifter 106 may receive a respective input signal having the first voltage range and may provide a corresponding level-shifted signal having the second voltage range.

Within first processing circuit 620a, logic circuit 630a receives the K input signals having the first voltage range, implements the desired logic function on the K input signals, and provides its output to delay circuit 640a. Logic circuit 630a may be implemented with inverters, logic gates, and/or other logic components. Delay circuit 640a operates on the output signal from logic circuit 630a and provides a first intermediate signal, Vtop, having the first voltage range. Delay circuit 640a may be implemented with an even number of inverters coupled in series. These inverters may be implemented with MOS transistors of suitable dimensions to obtain the desired delay, low-to-high transition, and high-to-low transition for the Vtop signal in order to avoid voltage spikes in output circuit 650 during switching.

Within second processing circuit 620b, logic circuit 630b receives the K level-shifted signals having the second voltage range, implements the desired logic function on the K level-shifted signals, and provides its output to delay circuit 640b. Logic circuit 630b may be implemented with inverters, logic gates, and/or other logic components in similar manner as logic circuit 630a. Delay circuit 640b operates on the output signal from logic circuit 630b and provides a second intermediate signal, Vbot, having the second voltage range. Delay circuit 640b may be implemented with an even number of inverters coupled in series. These inverters may be implemented with MOS transistors of suitable dimensions to obtain the desired delay and transitions for the Vbot signal in order to avoid voltage spikes in output circuit 650 during switching. Delay circuits 640a and 640b may also be omitted. In this case, the desired delay and transitions may be achieved by selecting suitable dimensions for the MOS transistors in logic circuits 630a and 630b.

In the exemplary design shown in FIG. 6, output circuit 650 includes an NMOS transistor 652 and a PMOS transistor 654. NMOS transistor 652 has its gate coupled to circuit ground, its source receiving the Vbot signal from delay circuit 640b, and its drain providing the Vout signal. PMOS transistor 654 has its gate coupled to circuit ground, its source receiving the Vtop signal from delay circuit 640a, and its drain coupled to the drain of NMOS transistor 652.

As shown in FIG. 6, output circuit 650 is implemented with an inverter having its input connected to circuit ground and its upper and lower supply voltages provided by the Vtop and Vbot signals, respectively. The Vtop and Vbot signals have the same logic value but different voltage ranges. For a logic high output, the Vtop signal is at Vdd and the Vbot signal is at 0V. In this case, NMOS transistor 652 is turned off, PMOS transistor 654 is turned on, and the Vout signal is set to Vdd. Conversely, for a logic low output, the Vtop signal is at 0V and the Vbot signal is at Vss. In this case, NMOS transistor 652 is turned on, PMOS transistor 654 is turned off, and the Vout signal is set to Vss. The Vout signal thus has the full voltage range even though MOS transistors 652 and 654 observe only the first or second voltage range at any given moment.

Although not shown in FIG. 6, another level shifter may be used for the top path and may receive the K input signals having the first voltage range and provide K level-shifted signals having a third voltage range. Logic circuit 630a and delay circuit 640a in first processing circuit 620a may then operate between the third voltage range. Output circuit 650 may operate between the second or third voltage range at any given moment.

The first and second voltage ranges may each be less than the breakdown voltage of the MOS transistors used to implement logic circuit 600. The full voltage range may be greater than the breakdown voltage of the MOS transistors used to implement output circuit 650. However, these MOS transistors observe only the first or second voltage range at any given moment even though the Vout signal can swing the full voltage range.

The level shifters and high voltage logic circuits described herein may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. The use of the level shifters and/or the high voltage logic circuits in a wireless communication device, which may be a cellular phone or some other device, is described below.

Figure 7:
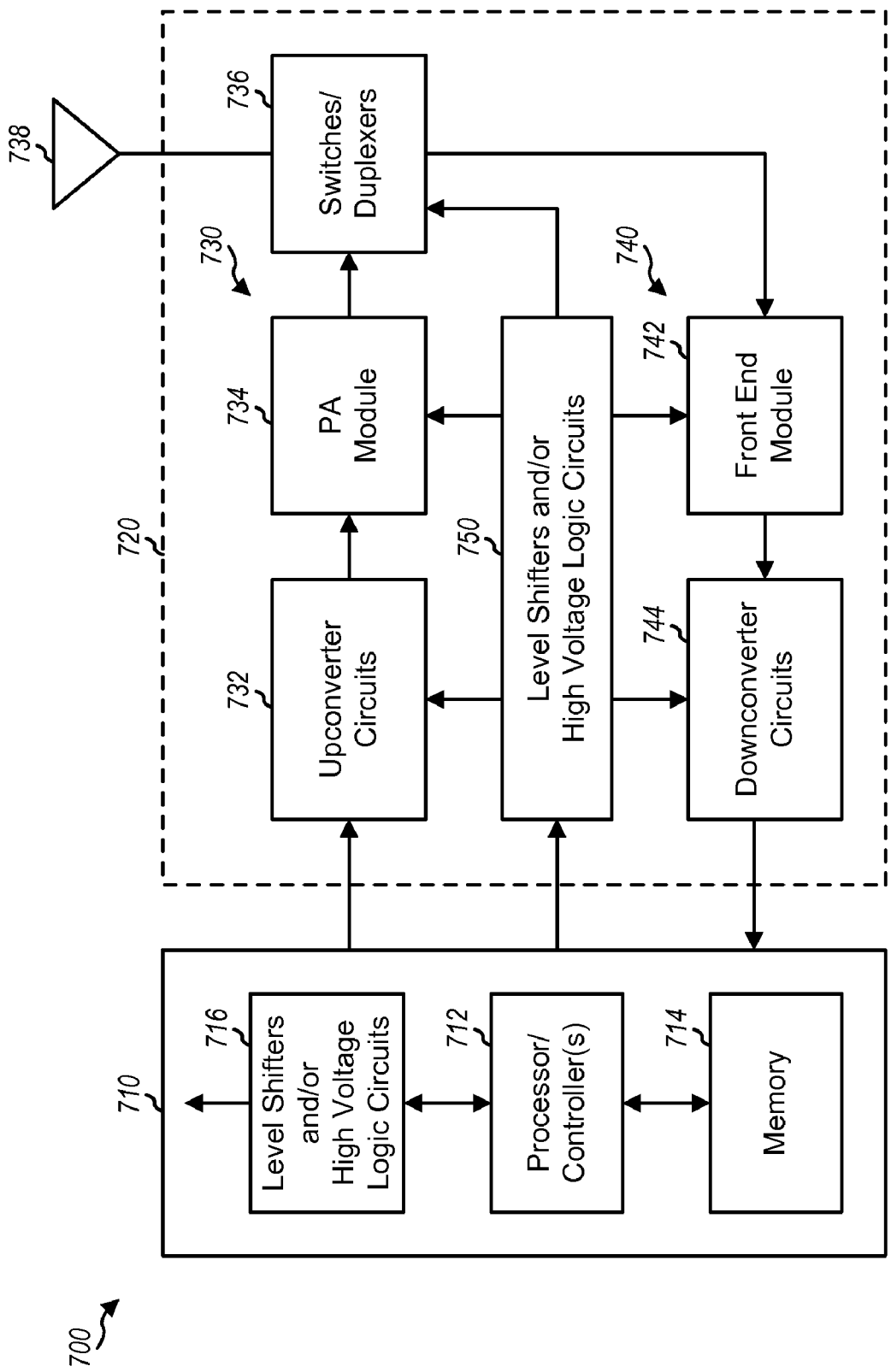
FIG. 7 shows an exemplary design of a wireless communication device.

FIG. 7 shows a block diagram of an exemplary design of a wireless communication device 700. In this exemplary design, wireless device 700 includes a digital section 710 and a transceiver 720. Transceiver 720 includes a transmitter 730 and a receiver 740 that support bi-directional communication.

Within digital section 710, processor/controller(s) 712 may perform various functions for wireless device 700, e.g., processing for data being transmitted or received. A memory 714 may store program codes and data for processor/controller(s) 712. Level shifters and/or high voltage logic circuits 716 may receive input signals, e.g., from processor/controller(s) 712 and/or other circuit blocks, and may generate output signals. Digital section 710 may also include other modules, processors, memories, etc.

In the transmit path, digital section 710 may process (e.g., encode and modulate) data to be transmitted and provide an output baseband signal to transmitter 730. Within transmitter 730, upconverter circuits 732 may process (e.g., amplify, filter, and frequency upconvert) the output baseband signal and provide an upconverted signal. A power amplifier (PA) module 734 may amplify the upconverted signal to obtain the desired output power level and provide an output radio frequency (RF) signal, which may be routed through switches/duplexers 736 and transmitted via an antenna 738.

In the receive path, antenna 738 may receive RF signals transmitted by base stations and/or other transmitter stations and may provide a received RF signal, which may be routed via switches/duplexers 736 and provided to receiver 740. Within receiver 740, a front end module 742 may process (e.g., amplify and filter) the received RF signal and provide an amplified RF signal. Downconverter circuits 744 may further process (e.g., frequency downconvert, filter, and amplify) the amplified RF signal and provide an input baseband signal to digital section 710. Digital section 710 may further process (e.g., digitize, demodulate, and decode) the input baseband signal to recover transmitted data.

Level shifters and/or high voltage logic circuits 750 may receive input signals from digital section 710 and may generate output signals for upconverter circuits 732, PA module 734, switches/duplexers 736, front end module 742, and/or downconverter circuits 744. For example, level shifters and/or high voltage logic circuits 750 may generate control signals for switches and/or other circuit components within PA module 734 and switches/duplexers 736.

In an exemplary design, an apparatus (e.g., an integrated circuit, an electronic unit, a wireless device, etc.) may include a level shifter comprising a driver circuit coupled to a latch, e.g., as shown in FIG. 1A. The driver circuit may receive an input signal having a first voltage range and may provide a drive signal having a second voltage range different from the first voltage range. The latch may receive the drive signal and provide an output signal having the second voltage range. In an exemplary design, the driver circuit may comprise a control signal generator coupled to a latch driver, e.g., as shown in FIG. 1B. The control signal generator may receive the input signal and provide a control signal having a third/full voltage range larger than each of the first and second voltage ranges. The latch driver may receive the control signal and provide the drive signal. The input signal may be a differential signal comprising Vinp and Vinn signals. The drive signal may be another differential signal comprising Vdrp and Vdrn signals.

In an exemplary design, the driver circuit may comprise four inverters and two MOS transistors, e.g., as shown in FIG. 3 or 5. A first inverter (e.g., inverter 312 in FIG. 3) may receive the Vinp signal and provide a first intermediate signal, Vintp. A second inverter (e.g., inverter 314) may be coupled to the first inverter and may receive the first intermediate signal and provide a first control signal, Vctrlp. A first MOS transistor (e.g., NMOS transistor 322) may be coupled to the second inverter and may receive the first control signal and provide the Vdrp signal. A third inverter (e.g., inverter 316) may receive the Vinn signal and provide a second intermediate signal, Vintn. A fourth inverter (e.g., inverter 318) may be coupled to the third inverter and may receive the second intermediate signal and provide a second control signal, Vctrln. A second MOS transistor (e.g., NMOS transistor 324) may be coupled to the fourth inverter and may receive the second control signal and provide the Vdrn signal.

In an exemplary design, the first and third inverters may each operate between the first voltage range. The second and fourth inverters may each operate between either the first voltage range or the second voltage range, depending on the logic value of the input signal. The second inverter may receive the Vintp signal and the Vdrp signal as supply voltages. The fourth inverter may receive the Vintn signal and the Vdrn signal as supply voltages. The second inverter may operate between the first voltage range and may provide a first voltage (e.g., Vdd) for the Vctrlp signal when the input signal has a first logic value. The second inverter may operate between the second voltage range and may provide a second voltage (e.g., Vss) for the Vctrlp signal when the input signal has a second logic value. The third voltage range may be defined by the first and second voltages.

In an exemplary design, the first and second MOS transistors may be NMOS transistors having their drains coupled to a high voltage of the second voltage range and their sources providing the Vdrp and Vdrn signals, respectively, e.g., as shown in FIG. 3. In another exemplary design, the first and second MOS transistors may be PMOS transistors having their drains coupled to a low voltage of the second voltage range and their sources providing the Vdrp and Vdrn signals, respectively, e.g., as shown in FIG. 5.

In an exemplary design, the first voltage range may be non-overlapping with the second voltage range. The first voltage range may cover a range of positive voltages, and the second voltage range may cover a range of negative voltages. Alternatively, the first voltage range may cover a first range of positive voltages, and the second voltage range may cover a second range of positive voltages different from the first range of positive voltages. The driver circuit and the latch may be implemented with MOS transistors having a breakdown voltage that may be larger than each of the first and second voltage ranges but less than the third voltage range.

Figure 8:
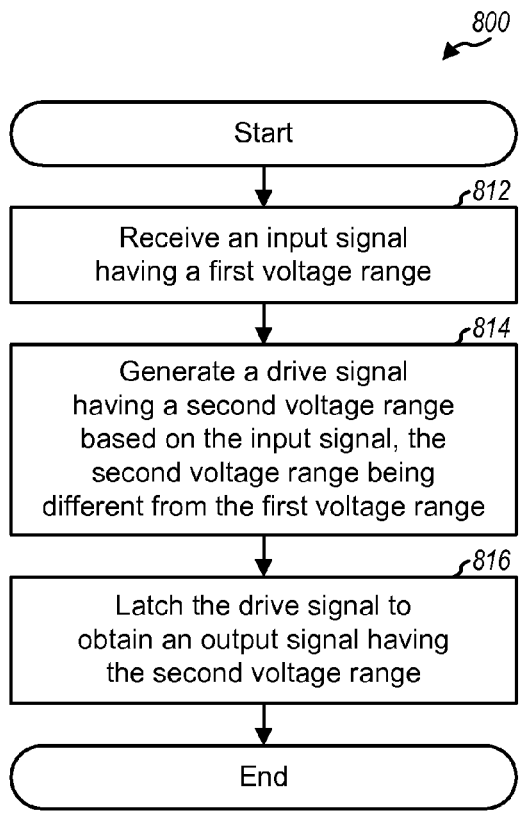
FIG. 8 shows an exemplary design of a process for performing level shifting.

FIG. 8 shows an exemplary design of a process 800 for performing level shifting. An input signal having a first voltage range may be received (block 812). A drive signal having a second voltage range may be generated based on the input signal (block 814). The second voltage range may be different from the first voltage range. The drive signal may be latched to obtain an output signal having the second voltage range (block 816).

In an exemplary design of block 814, a control signal having a third/full voltage range may be generated based on the input signal. The third voltage range may be larger than each of the first and second voltage ranges. The drive signal may then be generated based on the control signal.

The input signal may be a differential signal comprising Vinp and Vinn signals, and the drive signal may be another differential signal comprising Vdrp and Vdrn signals. In an exemplary design of block 814, a first intermediate signal may be generated (e.g., with a first inverter) based on the Vinp signal. A first control signal may be generated (e.g., with a second inverter) based on the first intermediate signal. The Vdrp signal may be generated (e.g., with a first MOS transistor) based on the first control signal. A second intermediate signal may be generated (e.g., with a third inverter) based on the Vinn signal. A second control signal may be generated (e.g., with a fourth inverter) based on the second intermediate signal. The Vdrn signal may be generated (e.g., with a second MOS transistor) based on the second control signal.

In another exemplary design, an apparatus (e.g., an integrated circuit, an electronic unit, a wireless device, etc.) may include a high voltage logic circuit comprising a level shifter, first and second circuits, and an output circuit, e.g., as shown in FIG. 6. The level shifter may receive at least one input signal having a first voltage range and may provide at least one level-shifted signal having a second voltage range. The first circuit may process the at least one input signal based on a logic function and may provide a first intermediate signal having the first voltage range. The second circuit may process the at least one level-shifted signal based on the logic function and may provide a second intermediate signal having the second voltage range. The output circuit may receive the first and second intermediate signals and may provide an output signal having a third voltage range larger than each of the first and second voltage ranges.

In an exemplary design, the level shifter may comprise at least one driver circuit coupled to at least one latch, e.g., one set of driver circuit and latch for each input signal. The at least one driver circuit may receive the at least one input signal and may provide at least one drive signal having the second voltage range. The at least one latch may receive the at least one drive signal and may provide the at least one level-shifted signal. The first circuit may comprise (i) a first logic circuit to receive and process the at least one input signal based on the logic function and (ii) a first delay circuit to obtain target delay and transitions for the first intermediate signal. The second circuit may comprise (i) a second logic circuit to receive and process the at least one level-shifted signal based on the logic function and (ii) a second delay circuit to obtain target delay and transitions for the second intermediate signal. The first and/or second circuit may also exclude the delay circuit. The output circuit may comprise a PMOS transistor and an NMOS transistor, which may be coupled as shown in FIG. 6.

Figure 9:
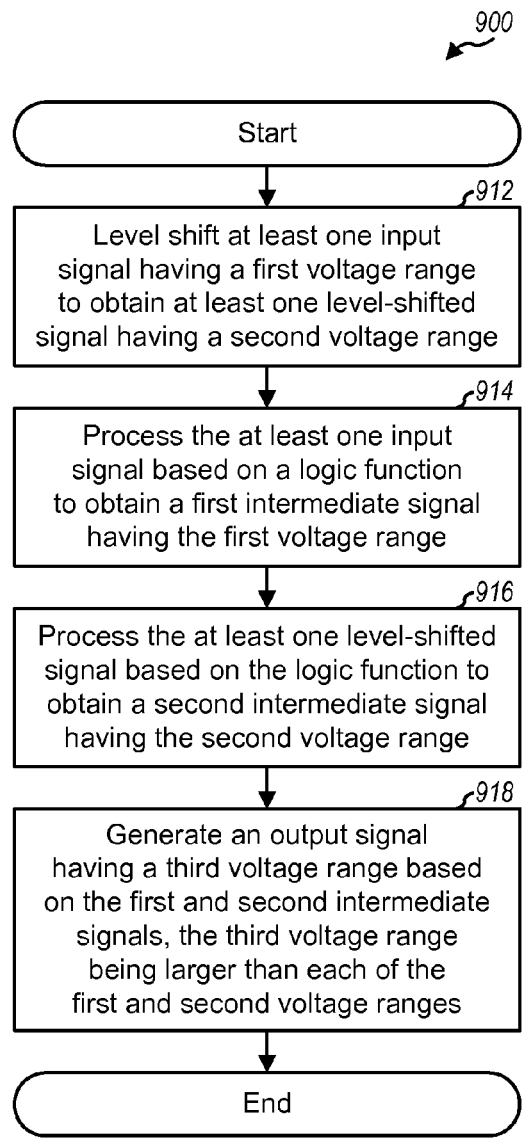
FIG. 9 shows an exemplary design of a process for generating a signal.

FIG. 9 shows an exemplary design of a process 900 for generating a signal with a larger voltage swing. At least one input signal having a first voltage range may be level shifted to obtain at least one level-shifted signal having a second voltage range (block 912). The at least one input signal may be processed based on a logic function to obtain a first intermediate signal having the first voltage range (block 914). The at least one level-shifted signal may be processed based on the logic function to obtain a second intermediate signal having the second voltage range (block 916). An output signal having a third/full voltage range may be generated based on the first and second intermediate signals (block 918). The third voltage range may be larger than each of the first and second voltage ranges.

The level shifters and high voltage logic circuits described herein may be implemented on an IC, an analog IC, an RF IC (RFIC), a mixed-signal IC, an application specific integrated circuit (ASIC), a printed circuit board (PCB), an electronics device, etc. The level shifters and high voltage logic circuits may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the level shifters and/or high voltage logic circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a driver circuit including:
        a first and a second inverter and configured to receive a first and a second input signal of a differential input signal comprising Vinp and Vinn signals having a first voltage range at the first and second inverters, respectively, and provide a differential drive signal comprising Vdrp and Vdrn signals having a second voltage range different from the first voltage range;
        the first inverter to receive the Vinp signal and provide a first intermediate signal,
        a third inverter coupled to the first inverter and to receive the first intermediate signal and provide a first control signal,
        a first metal oxide semiconductor (MOS) transistor coupled to the third inverter and to receive the first control signal and provide the Vdrp signal,
        the second inverter to receive the Vinn signal and provide a second intermediate signal,
        a fourth inverter coupled to the second inverter and to receive the second intermediate signal and provide a second control signal, and
        a second MOS transistor coupled to the fourth inverter and to receive the second control signal and provide the Vdrn signal; and
    a latch coupled to the driver circuit and to receive the differential drive signal and provide an output signal having the second voltage range.

2. The apparatus of claim 1 the driver circuit comprising
    a control signal generator to receive the input signal and provide a control signal having a third voltage range larger than each of the first and second voltage ranges, and
    a latch driver coupled to the control signal generator and to receive the control signal and provide the drive signal.

3. The apparatus of claim 1, the first and second inverters each operates between the first voltage range, and the third and fourth inverters each operates between either the first voltage range or the second voltage range depending on a logic value of the input signal.

4. The apparatus of claim 1, the third inverter receives the first intermediate signal and the Vdrp signal as supply voltages, and the fourth inverter receives the second intermediate signal and the Vdrn signal as supply voltages.

5. The apparatus of claim 1, the third inverter operates between the first voltage range and provides a first voltage for the first control signal when the input signal has a first logic value, the third inverter operates between the second voltage range and provides a second voltage for the first control signal when the input signal has a second logic value, the first and second voltages define a third voltage range larger than each of the first and second voltage ranges.

6. The apparatus of claim 1, the first and second MOS transistors are N-channel MOS (NMOS) transistors having drains coupled to a high voltage of the second voltage range and sources providing the Vdrp and Vdrn signals, respectively.

7. The apparatus of claim 1, the first and second MOS transistors are P-channel MOS (PMOS) transistors having drains coupled to a low voltage of the second voltage range and sources providing the Vdrp and Vdrn signals, respectively.

8. The apparatus of claim 1, the first voltage range is non-overlapping with the second voltage range.

9. The apparatus of claim 1, the first voltage range covers a range of positive voltages and the second voltage range covers a range of negative voltages.

10. The apparatus of claim 1, the first voltage range covers a first range of positive voltages and the second voltage range covers a second range of positive voltages different from the first range of positive voltages.

11. The apparatus of claim 1, the driver circuit and the latch are implemented with metal oxide semiconductor (MOS) transistors having a breakdown voltage, each of the first and second voltage ranges is less than the breakdown voltage.

12. A method comprising:
    receiving a first and a second input signal of a differential input signal comprising Vinp and Vinn signals having a first voltage range at a first inverter and a second inverter, respectively;
    generating a differential drive signal comprising Vdrp and Vdrn signals having a second voltage range based on the differential input signal, the second voltage range being different from the first voltage range, the generating the differential drive signal comprising:
        generating a first intermediate signal based on the Vinp signal,
        generating a first control signal based on the first intermediate signal, generating the Vdrp signal based on the first control signal, generating a second intermediate signal based on the Vinn signal, generating a second control signal based on the second intermediate signal, and generating the Vdrn signal based on the second control signal; and latching the differential drive signal to obtain an output signal having the second voltage range.

13. The method of claim 12, the generating the differential drive signal comprising generating a control signal having a third voltage range based on the input signal, the third voltage range being larger than each of the first and second voltage ranges, and generating the differential drive signal based on the control signal.

14. An apparatus comprising:

means for receiving a first and a second input signal of a differential input signal comprising Vinp and Vinn signals having a first voltage range at a first inverter and a second inverter, respectively;

means for generating a differential drive signal comprising Vdrp and Vdrn signals having a second voltage range based on the differential input signal, the second voltage range being different from the first voltage range, the generating the differential drive signal comprising:

generating a first intermediate signal based on the Vinp signal, generating a first control signal based on the first intermediate signal, generating the Vdrp signal based on the first control signal, generating a second intermediate signal based on the Vinn signal, generating a second control signal based on the second intermediate signal, and generating the Vdrn signal based on the second control signal; and means for latching the differential drive signal to obtain an output signal having the second voltage range.

15. The apparatus of claim 14, the means for generating the differential drive signal comprising means for generating a control signal having a third voltage range based on the input signal, the third voltage range being larger than each of the first and second voltage ranges, and means for generating the differential drive signal based on the control signal.

* * * * *